(12) United States Patent
Veneklasen et al.

(10) Patent No.: US 6,392,333 B1
(45) Date of Patent: May 21, 2002

(54) ELECTRON GUN HAVING MAGNETIC COLLIMATOR

(75) Inventors: Lee H. Veneklasen, Castro Valley; William J. DeVore, Hayward; Rudy F. Garcia, Neward, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/263,137

(22) Filed: Mar. 5, 1999

(51) Int. Cl.$^7$ ............................................. H05H 1/00
(52) U.S. Cl. ..................... 313/361.1; 313/363.1; 313/153; 313/336; 313/155; 313/158
(58) Field of Search .................. 313/336, 309, 313/495, 496, 497, 361.1, 362.1, 363.1, 153, 155, 158, 422, 421, 433; 345/74, 75; 315/111.81

(56) References Cited

U.S. PATENT DOCUMENTS

| | | | |
|---|---|---|---|
| 3,802,935 A | | 4/1974 | Martin et al. |
| 5,041,732 A | * | 8/1991 | Saito et al. ............... 313/361.1 |
| 5,070,282 A | * | 12/1991 | Epsztein ..................... 313/336 |
| 5,122,663 A | | 6/1992 | Chang et al. ................ 250/310 |
| 5,155,412 A | | 10/1992 | Chang et al. .................. 315/14 |
| 5,449,968 A | * | 9/1995 | Terui et al. ............... 313/362.1 |
| 5,604,401 A | * | 2/1997 | Makishima .................. 313/309 |
| 5,708,327 A | * | 1/1998 | O'Boyle ..................... 313/495 |
| 5,962,961 A | * | 10/1999 | Sakai et al. .................. 313/336 |
| 6,008,577 A | * | 12/1999 | Rasmussen et al. ......... 313/496 |

OTHER PUBLICATIONS

PCT Written Opinion, mailed Jun. 29, 2001, International Prelimary Examining Authority, Commissioner of Patents and Trademarks, Box PCT, Washington, D.C. 20231.
Lee H. Veneklasen, "Some General Considerations Concerning the Optics of the Field Emission Illumination System", OPTIK, vol. 36, No. 4, 410–433 (1972).
T.H.P. Chang et al., "Electron beam technology—SEM to microcolumn", Microelectronic Engineering 32 (1996), pp. 113–130.
A. Delong et al., "A new design of field emission electron gun with a magnetic lens", OPTIK vol. 81, No. 3, (1989) pp. 103–108.
T.H.P. Chang et al., "Electron beam microcolumn technology and applications", SPIE (1995) vol. 2522, pp. 4–12.
E. Kratschmer et al., "Experimental evaluation of a 20×20 footprint microcolumn", J. Vac. Sci. Technol. B 14(6), Nov./Dec. 1996, pp. 3792–3796.
M.G.R. Thomson et al., "Lens and deflector design for microcolumns", J. Vac. Sci. Technol. B 13(6), Nov./Dec. 1995, pp. 2445–2449.
K.Y. Lee et al., "High aspect ration aligned multilayer microstructure fabrication", J. Vac. Sci. Technol. B 12(6), Nov./Dec. 1994, pp. 3425–3430.
H.S. Kim et al., "Miniature Schottky electron source", J. Vac. Sci. Technol. B 13(6), Nov./Dec. 1995, pp. 2468–2472.

* cited by examiner

*Primary Examiner*—Nimeshkumar D. Patel
*Assistant Examiner*—Mariceli Santiago
(74) *Attorney, Agent, or Firm*—Janah & Associates

(57) ABSTRACT

An enhanced electron source in most respects similar to a standard cathode assembly for an electron gun includes an electron emitter surrounded by a suppressor electrode, the emitted electrons passing through an extractor electrode. Additionally, the suppressor electrode includes a small ring shaped permanent magnet surrounding the opening in the suppressor electrode through which the emitter tip protrudes. The resulting magnetic field is aligned with the beam axis, and includes a tail which forms a very short focal length magnetic lens immediately following the emitter tip. This magnetic field collimates the electron beam before it enters the downstream electrostatic gun lens, thus increasing the effective angular intensity of the cathode assembly. The aberrations of this collimating lens are very low so that its useful brightness is not reduced. Also the influence of guns lens aberrations is reduced because a smaller aperture angle in the gun lens may be used to obtain higher beam current.

22 Claims, 1 Drawing Sheet

ELECTRON GUN HAVING MAGNETIC COLLIMATOR

FIELD OF THE INVENTION

This invention relates to electron guns (sources) for use for instance in electron beam lithography, and to the cathodes (electron emitters) of such guns.

BACKGROUND

Electron beam columns are well known for use, for instance, in electron beam lithography for imaging a pattern onto a substrate typically coated with a resist sensitive to electron beams. Subsequent development of the exposed resist defines a pattern in the resist which later can be used as a pattern for etching or other processes. Electron beam columns are also used in electron microscopy for imaging surfaces and thin samples. Conventional electron beam columns for electron microscopy and lithography are well known and typically include an electron gun, including an electron emitter, that produces an electron beam. The beam from the gun may be used to produce a scanning probe, or may be used to illuminate a sample or an aperture using a series of electron beam lenses, which are magnetic or electrostatic lenses.

A well-known variant is called a microcolumn which is a very short and small diameter electron beam column typically used in an array of such columns; See "Electron beam technology—SEM to microcolumn" by T. H. P. Chang et al., *Microelectronics Engineering*, 32 (1996) p. 113–130. See also U.S. Pat. No. 5,122,663 to T. H. P. Chang et al. issued Jun. 16, 1992, also describing microcolumns. These documents are incorporated herein by reference.

Both conventional electron beam columns and microcolumns include a source of electrons. In one version this source is a conventional Schottky emission gun or a field emission gun (generally referred to as electron guns) which typically includes an emitter (cathode) and the triode region surrounding the emitter (see FIG. 1) downstream of which, with respect to the direction of the electron beam, is an electrostatic pre-accelerator lens that focuses and accelerates the electron beam to its final energy. As described above, this gun optics is followed by a series of lenses which refocuses and images the source aperture or sample onto the target.

It has generally been difficult in the prior art to obtain very high beam currents using high brightness electron sources. Although the brightness of the cathode (the electron emitter) is high in such sources, the angular intensity of the electron beam emerging from the emitter region is limited by the properties of the cathode itself. This means that a rather high aperture angle must be used in the electron gun optics. (Optics here refers to structures for handling and manipulation of electron beams and not to conventional light optics.) This makes spherical and chromatic aberration in the gun lens a major factor limiting the beam current that may be obtained in a small spot (spot here refers to the diameter of a cross-section of the beam).

Optimization of such electron guns is described in "Some general considerations concerning the optics of the field emission illumination system," L. H. Veneklasen, *Optik*, 36 (1972) p. 410–433. This document shows that sources with not only high brightness but also high angular intensity are needed for optimal high current performance.

Modern electron beam lithography systems for use, for instance, in the semiconductor field (mask making or direct writing of integrated circuit patterns on a semiconductor wafer) favor a shaped beam (other than Gaussian in cross-section) so that more than one pixel is exposed simultaneously. Pixel refers to a picture element in the exposed image. Optimum formation of very small high current density shaped beams uses shadow projection optics as disclosed in, for instance, U.S. patent application Ser. No. 09/058,258 filed Apr. 10, 1998 entitled "Shaped Shadow Projection for Electron Beam Column", Lee H. Veneklasen et al., incorporated herein by reference in its entirety. In such optics, the beam shape is a projection shadow of one or more shaping apertures. It has been shown that the distortion of such shadow projection shapes depends upon the spherical aberration of the electron gun and objective lens. This kind of optics requires a high brightness cathode for good feature edge resolution in the projected image and also requires a high angular intensity cathode to minimize gun aberrations. Thus high current shadow projection optics as well as Gaussian optics (referring to a rounded somewhat diffused spot) benefit from a high angular intensity source.

FIG. 1 shows in a side cross sectional view a prior art high brightness electron source and triode region 10 which is typically part of an electron beam column and also referred to generally as an electron gun. The remainder of the electron beam column is not shown. This is exemplary of a field emission or Schottky emission gun. Details of such a device are shown in L. Swanson and G. Schwind, "A Review of the ZRO/W Schottky cathode", *Handbook of Charged Particle Optics* editor Jon Orloff, CRC Press LLC, New York, (1997) incorporated herein by reference. The depicted rays 26 in FIG. 1 show the limits 29 (envelope) of the useful high brightness electron beam and those electrons 30 passing through the extractor aperture 28. The angular intensity is the total current in beam 30 divided by the solid angle into which the cathode 14 is emitting. The remainder of the "shank" emission 20 is thermionic and contributes to the total emission current but not to the useful beam 30 current and hence is effectively wasted, since there it impinges on the outside of the extractor electrode structure 24 and is not part of the final beam 30. The cathode 14 is typically an oriented single crystal tungsten structure with a sharp point (approximately 1 micrometer radius) and mounted on a hair pin filament (not shown).

This assembly is surrounded by the negatively biased suppressor electrode 16 which is typically a conductive structure that prevents thermionically emitted electrons from leaving the cathode 14 anywhere but near its tip. The pointed tip of cathode 14 protrudes slightly from the suppressor electrode 16 and faces the extractor electrode (anode) 24 Which defines small diameter hole 29. The extractor electrode 24 is biased positively with respect to the cathode 14 and defines an aperture 28 below the upper hole 29 to shape the final beam 30 entering the downstream gun lens (not shown). It is the combination of the electric field and temperature that causes emission from low work function facets of the cathode 14.

There have been prior attempts to improve the performance of such Schottky and field emission guns. One attempt is to reduce the aberrations of the electrostatic gun lens. This is difficult using standard electrostatic lenses whose size and focal length are limited by the need for high voltage stand-off distances (the lens voltages are typically extremely high in the thousands or tens of thousands of volts).

It is also possible to use a magnetic lens near the cathode. For an example see "A New Design of a Field Emission Electron Gun with a Magnetic Lens" Delong et al., *Optik*, 81:3 (1989), pp. 103–108. This discloses that the cathode is deeply immersed in the magnetic field of a miniature magnetic lens of low chromatic and spherical aberration. This leads to an appreciable increase in the operating solid angle of emission compared with other designs. The magnetic pole pieces are built into the gun to provide a preaccelerator lens with very low aberrations. This preaccelerator lens uses coils to provide the magnetic lens, and uses two iron pole pieces to form the focusing field. However, this approach disadvantageously requires major modifications of the gun design and geometry and so is not suitable for installation in a conventional electrostatic electron gun as in FIG. 1.

Another approach is to change the electron gun operating conditions so as to increase the angular intensity of the electrons leaving the cathode surface, thus allowing more electrons into the usual acceptance area of the gun lens. This requires increasing the current density and/or increasing the radius of the approximately spherical or faceted cathode tip so that more electrons are emitted into a particular solid angle. The result is a higher extraction voltage and a larger total emission current. Total emission current, the field of the surface and the voltage available for emission are all limited by other considerations (for example, gun design and material). Thus it is not easy to improve the angular intensity of high brightness electron emitters much beyond what they currently provide (one milliamp per solid radian) without adverse side effects. In particular the energy spread increases and it becomes difficult to maintain the cathode shape, emission stability and noise necessary for precision lithography. Hence this approach is not very promising.

SUMMARY

In accordance with this invention, performance of Schottky and field emission electron guns whose performance is limited by aberrations is improved. This improvement collimates the electron beam that leaves the emitter (cathode), thus condensing the electron emission from the same area on the cathode into a narrower angle, before it enters the gun lens. A method and structure for such precollimation disclosed here allows standard cathodes to be used with standard electrostatic gun optics, so major electron gun redesign is not required.

Hence a novel modification is made to what is otherwise a standard electron gun cathode assembly in either a conventional electron gun or a microcolumn. In accordance with the invention, the conventional suppressor electrode enclosing the cathode (emitter) is modified to include a small ring shaped permanent magnet surrounding the hole through which the cathode tip protrudes. The tail of the axial magnetic field from this permanent magnet creates a short focal length immersion magnetic lens immediately downstream of the cathode tip. This magnetic field collimates the electron beam before it enters the downstream electrostatic gun lens, thus increasing the effective angular intensity of the electron gun. The aberrations of this collimating lens are very low so its useful brightness is not reduced. However, the influence of gun lens aberrations is reduced because advantageously a smaller aperture angle may be used in the electrostatic preaccelerator gun lens to obtain higher beam current or smaller source image.

DETAILED DESCRIPTION

Figure 1:
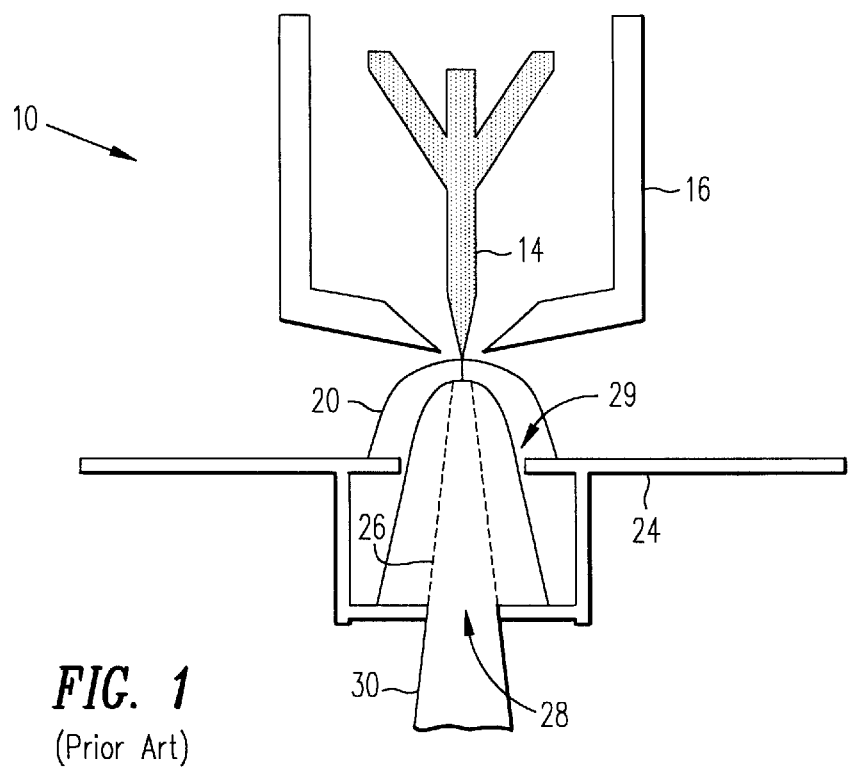
FIG. 1 shows a prior art electron source.
Figure 2:
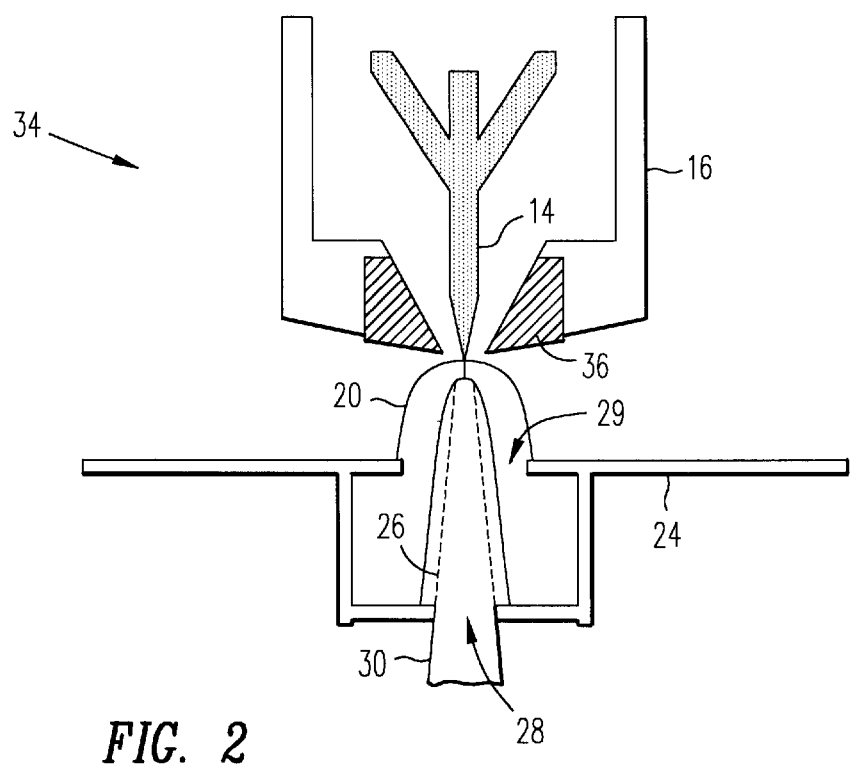
FIG. 2 shows an electron source in accordance with this invention.

FIG. 2 shows a structure 34 in most respects similar that of FIG. 1 (in a similar view) with similar elements identically labeled and with the addition of, as described above, a strong but small ring shaped permanent magnet 36 in the suppressor electrode 16. The permanent magnet 36 defines the opening in the suppressor electrode 16 through which the cathode 14 tip protrudes. The cathode 14 tip and the portion of the electron beam path between the cathode tip and the extractor electrode 24 are immersed in the fringing field of the permanent magnet 36. Its magnetic field is aligned with the beam axis, and its field strength decreases rapidly downstream of the cathode. This gun also uses a conventional electrostatic lens structure (not shown). A difference between source 34 and the magnetic gun lens referred to above (Delong et al.) is that the present structure uses a permanent magnet which is located in the suppressor electrode 16 through which the cathode 14 (emitter) tip protrudes.

Thus the resulting magnetic field formed by permanent magnet 36 provides the effect of a focusing lens that collimates the electron beam as it leaves the cathode 14. The electrostatic conditions at the cathode are not influenced by the magnetic field so the conditions at the cathode surface, including temperature, current density, dynamics of shape stability and initial angular intensity are not changed. It is intended that there be no changes in the operating properties of the cathode itself compared to that of the FIG. 1 source. However due to the collimation action of the magnetic lens due to the permanent magnet 36, the electron beam emerging from the cathode 14 region has a higher angular intensity. One may either use a smaller aperture 28 to minimize gun aberrations., or may use a larger aperture 28 to increase current at a given aperture angle.

This magnetic lens, referred to herein as an immersion magnetic lens (because the cathode is in its magnetic field), can provide a very strong magnetic field that is confined near the cathode 14. Its aberrations are much smaller than the aberrations of an additional gun lens conventionally placed downstream from the extractor 24. The net effect is to increase the angular intensity of the electron source without substantially degrading its effective brightness. Since a smaller aperture angle may be used in the gun lens, the present gun lens contributes less spherical and chromatic aberration, thereby becoming less of a limiting factor in the overall electron beam column optics.

The permanent magnet 36 in one embodiment is a small ring shaped disc (toroid) of magnetic material such as samarium cobalt that is shaped appropriately to act as a part of the suppressor electrode and is press fitted into the remaining portion of the suppressor electrode 16. In order to maximize the fringing field at the suppressor electrode 16 hole and minimize the extension of the magnetic field into the extractor 24 region, it is desirable to make both the inner opening defined by the permanent magnetic 36 and its outer diameter as small as possible. In one illustrative embodiment the outer diameter of the permanent magnet 36 is approximately 0.25 centimeters and its opening (inner) diameter is approximately 0.04 centimeters. An alternative size is O.D. of about 0.5 centimeters and I.D. of about 0.1 centimeters; these dimensions are not limiting. Roundness of the opening and centering with regard to the cathode 14 tip minimize alignment problems and undesirable astigmatic effects.

For fabrication of the FIG. 2 structure, in order to uniformly magnetize the permanent magnet, in one embodiment the assembled suppressor unit including the suppressor electrode 16 and the installed permanent magnet 36 are heated above the Curie point of the permanent magnet material so as to completely demagnetize the permanent magnetic material. The permanent magnet is then magnetized to the desired field strength (e.g. 10–50 K Gauss) in a homogenous solonoidal electromagnet. The degree of lens collimation is determined by the permanent magnet's residual permanent magnetism, which may be adjusted during this magnetizing procedure to match the extractor voltage used in the system. The goal is to create a permanent lens whose focal length is in the range of ½ to ¼ that of the downstream electrostatic gun lens.

The magnetic focusing provided by the FIG. 2 source 34 may have a beneficial effect upon the depicted shank emission 20 which emerges from the cathode 14 perpendicular to the electron beam axis. The magnetic field may tend to confine this shank emission 20 towards the electron beam axis, allowing more of it to pass through the aperture hole 28 in the extractor electrode 24. This may lead to less secondary emission in the emitter region, which advantageously improves the gun vacuum in high voltage performance.

While FIG. 2 depicts a full sized conventional electron source, the permanent magnet disclosed herein may also be used in a microcolumn where a similar sized permanent magnet is used at the same location, which is the opening in the suppressor electrode. Hence fabrication of a microcolumn with the present permanent magnet would be similar to that disclosed above.

This disclosure is illustrative and not limiting; further modifications would be apparent to one skilled in the art in light of this disclosure and are intended to fall within the scope of the appended claims.

We claim:

1. An electron source for use in an electron beam column, the electron source comprising:
   an emitter terminating in a tip;
   a suppressor electrode laterally surrounding the emitter, the tip of the emitter protruding through the suppressor;
   a permanent magnet whose magnetic field is aligned with the beam axis, mounted on the suppressor electrode and defining a central opening through which the tip of the emitter protrudes; and
   an extractor electrode located adjacent the tip of the emitter.

2. The electron source of claim 1, wherein the extractor electrode further defines an aperture through which electrons from the tip of the emitter pass.

3. The electron source of claim 1, wherein the permanent magnet is of samarium cobalt.

4. The electron source of claim 1, wherein the opening defined in the permanent magnet has a diameter less than about 0.1 centimeters.

5. The electron source of claim 1, wherein an outer diameter of the permanent magnet is less than about 0.5 centimeters.

6. The electron source of claim 1, wherein the emitter is of oriented single crystal tungsten.

7. The electron source of claim 1, wherein the tip of the emitter has a radius of approximately 1 micrometer or less.

8. The electron source of claim 1, wherein the suppressor electrode is biased by an applied voltage.

9. The electron source of claim 8, wherein the extractor electrode is biased positive with respect to the emitter and suppressor electrode.

10. The electron source of claim 1, wherein the permanent magnet is toroidal in shape.

11. The electron source of claim 1, wherein the electron source is a microcolumn electron source.

12. An electron beam column capable of imaging a pattern onto a substrate, the electron beam column comprising:
    an electron source to produce an electron beam, the electron source comprising (i) an emitter terminating in a tip; (ii) a suppressor electrode laterally surrounding the emitter, the tip of the emitter protruding through the suppressor; (iii) a permanent magnet whose magnetic field is aligned with the beam axis, mounted on the suppressor electrode and defining a central opening through which the tip of the emitter protrudes; and (iv) an extractor electrode located adjacent the tip of the emitter;
    an electrostatic accelerating lens to accelerate the electrons of the electron beam; and
    one or more focusing lenses to focus the electron beam onto the substrate.

13. The electron beam column of claim 12, wherein the extractor electrode further defines an aperture through which electrons from the tip of the emitter pass.

14. The electron beam column of claim 12, wherein the permanent magnet is of samarium cobalt.

15. The electron beam column of claim 12, wherein the opening defined in the permanent magnet has a diameter less than about 0.1 centimeters.

16. The electron beam column of claim 12, wherein an outer diameter of the permanent magnet is less than about 0.5 centimeters.

17. The electron beam column of claim 12, wherein the emitter is of oriented single crystal tungsten.

18. The electron beam column of claim 12, wherein the tip of the emitter has a radius of approximately 1 micrometer or less.

19. The electron beam column of claim 12, wherein the suppressor electrode is biased by an applied voltage.

20. The electron beam column of claim 19, wherein the extractor electrode is biased positive with respect to the emitter and suppressor electrode.

21. The electron beam column of claim 12, wherein the permanent magnet is toroidal in shape.

22. The electron beam column of claim 12, wherein the electron source is a microcolumn electron source.

* * * * *